US006973957B2

(12) United States Patent
Naito

(10) Patent No.: US 6,973,957 B2
(45) Date of Patent: Dec. 13, 2005

(54) CONTINUOUS CASTING MOLD, A SHORTER SIDE THEREOF AND METHOD OF EXCHANGING THE SHORTER SIDE FRAME

(75) Inventor: Makoto Naito, Kurashiki (JP)

(73) Assignee: JFE Steel Corporation, Tokyo (JP)

( * ) Notice: Subject to any disclaimer, the term of this patent is extended or adjusted under 35 U.S.C. 154(b) by 427 days.

(21) Appl. No.: 10/296,149

(22) PCT Filed: Dec. 20, 2001

(86) PCT No.: PCT/JP01/11174

§ 371 (c)(1),
(2), (4) Date: Nov. 22, 2002

(87) PCT Pub. No.: WO03/053611

PCT Pub. Date: Jul. 3, 2003

(65) Prior Publication Data

US 2003/0160360 A1   Aug. 28, 2003

(51) Int. Cl.[7] ............... B22D 11/055; B22D 11/05; B22D 11/04
(52) U.S. Cl. ............... 164/485; 164/436; 164/443; 164/459; 164/491
(58) Field of Search .................. 164/436, 443, 164/459, 485, 491

(56) References Cited

U.S. PATENT DOCUMENTS

| | | | | |
|---|---|---|---|---|
| 3,292,216 A | * | 12/1966 | Colombo | 164/435 |
| 3,710,843 A | * | 1/1973 | Murakami et al. | 164/491 |
| 3,913,658 A | * | 10/1975 | Schmid | 164/435 |
| 3,926,244 A | * | 12/1975 | Meier et al. | 164/455 |
| 4,356,860 A | * | 11/1982 | Gladwin | 164/451 |
| 4,651,802 A | * | 3/1987 | Wrhen | 164/436 |
| 4,660,615 A | * | 4/1987 | Lemper | 164/418 |
| 4,699,201 A | * | 10/1987 | Gladwin | 164/436 |
| 5,322,112 A | * | 6/1994 | Sakata | 164/436 |
| 5,333,671 A | * | 8/1994 | Sera et al. | 164/436 |
| 5,472,040 A | * | 12/1995 | Bruckner | 164/436 |

FOREIGN PATENT DOCUMENTS

| | | | | |
|---|---|---|---|---|
| DE | 3420445 A1 | * | 12/1985 | B22D 11/04 |
| JP | 59039450 A | * | 3/1984 | B22D 11/04 |
| JP | 04224049 A | * | 8/1992 | B22D 11/04 |
| JP | 05007996 A | * | 1/1993 | B22D 11/04 |
| JP | 06054450 U | * | 7/1994 | B22B 11/04 |
| JP | 2002011550 A | * | 1/2002 | B22D 11/05 |
| JP | 3494129 B2 | * | 2/2004 | B22D 11/04 |

OTHER PUBLICATIONS

Machine English translation of JP 2002-011550 A, Mar. 2004, Japanese Patent Office website.*
JPO Abstract of JP 04224049 A, 1992, Japanese Patent Office.*

(Continued)

Primary Examiner—Michael P. Colaianni
Assistant Examiner—Michael I. Poe
(74) Attorney, Agent, or Firm—Oliff & Berridge, PLC

(57) ABSTRACT

A mold shorter side frame of a continuous casting mold is exchanged integrally as it is to enable on-line change of the thickness of the case piece. As the method, a concave portion for engaging a portion of the moving device and an attaching/detaching mechanism having a fixing jig for fixing the portion of the moving device are disposed at the back of the shorter side frame. Particularly, an attaching/detaching mechanism comprising a concave forming portion having a downwarded opening and a bolt screw passing from the back of the concave forming portion through at least a portion of said portion of the moving device is suitable.

16 Claims, 10 Drawing Sheets

OTHER PUBLICATIONS

JPO Abstract of JP 05007996 A, 1993, Japanese Patent Office.*

JPO Abstract of JP 59039450 A, 1984, Japanese Patent Office.*

EPO Abstract of DE 3420445 A1, 1985, European Patent Office.*

English translation of JP 04-224049 A, Apr. 2005, Schreiber Translations, Inc..*

English translation of JP 05-007996 A, Apr. 2005, The Thomson Corporation.*

English translation of JP 06-054450 U, Apr. 2005, The Thomson Corporation.*

* cited by examiner

A-A'

CONTINUOUS CASTING MOLD, A SHORTER SIDE THEREOF AND METHOD OF EXCHANGING THE SHORTER SIDE FRAME

TECHNICAL FIELD

This invention concerns a continuous casting mold such as for slabs, capable of changing the size of cast pieces and, particularly, it relates to a movable frame for a shorter side thereof (hereinafter referred to as a shorter side frame) and a method of exchanging the same.

BACKGROUND ART

In recent years, casting molds for use in continuous casting apparatus for cast pieces, particularly, large cast pieces such as slabs are constituted such that the size of the continuously cast slabs can be changed by displacing the position for each side of a mold during casting.

In the casting mold described above, the frame on the longer side of a cast piece cross section (longer side frame) is made larger in the width than that of the cast piece to be cast. Shorter side frames are put between the longer side frames of large width, and the shorter side frames are connected to a shorter side frame moving device, for example, a screw type cylinder for changing the width of the cast piece. The position of the shorter side frame and, accordingly, the width of the cast piece can be changed by the stroke of the cylinder.

On the other hand, for the change of the thickness of the cast piece, the size is changed by changing the position for the longer side frame of the mold and exchanging the shorter side frame with other frame conforming the gap between the longer side frames.

Heretofore, the moving device and the shorter side frame have been fixedly joined by means of a joint or the like. Upon changing the thickness of the cast piece, the mold has been detached entirely and a previously provided substitute mold in which a shorter frame of different thickness is set has been disposed to the line. However, the casting process has to be stopped for a long period of time by such operation procedures.

On the contrary, a technique aimed for simplifying the operation concerning exchange of the shorter side frame (for the change of the cast piece thickness) of a continuous casting mold includes a continuous casting mold capable of changing the thickness of the cast piece disclosed in JP-A-4-224049.

In this technique, the continuous casting mold capable of changing the thickness of the cast piece comprises a longer side stationary frame and a longer side movable frame capable of opening and closing by a remote control operation and a pair of shorter side frames put between the longer side frames in which the shorter side frame comprises a fixed shorter side frame connected with a moving device and a variable shorter side frame attached to/detached from the fixed shorter side frame and secured with a shorter side copper plate. Further, a cooling water channel is formed to the variable shorter side frame constituting the shorter side frame, and the water charge/discharge channel of the stationary shorter side frame and the water cooling channel of the variable shorter side frame are engaged/disengaged with each other at the frame mating surface. Further, the mating portion of the stationary shorter side frame and the variable shorter side frame comprises an engaging portion, to facilitate the positioning by the engaging portion.

However, in the technique described above of adopting a double structure for the shorter side frame, the thickness of the shorter side frame increases in the moving direction of the shorter side frame and the moving distance of the shorter side frame for the change of the cast piece width undergoes restriction. Further, since the weight of the shorter side frames inevitably increases compared with a one piece constitution, load is increased in a case of high speed change of width during casting and the large stroke for the change of width can not be taken. For extending the stroke, it is necessary to increase both the length and the diameter of the moving device for the change of the cast piece width, which results in increased installation cost, operation cost and, maintenance cost, and loss of space.

A further problem is a danger of water leakage. In the technique described above, the variable shorter side frame is adapted to be exchanged only for the copper plate section in order to minimize the portion to be exchanged. However, since contact of cooling water with the copper plate portion in such a structure can be attained only by providing a cooling water channel between the variable shorter side frame and the stationary frame, a countermeasure is required for the water leakage in the joined portion. This requires for example, a press cylinder for pressing the stationary shorter side frame and the variable shorter side frame in order to prevent water leakage from a portion between both of them. However, since the continuous casting operation handles also a powder such as continuous casting powder, obstacles such as powder tend to intrude to the joined portion between the two frames, which requires utmost care and long time for the joining operation. Further, since the continuous operation time (period) is increased along with increasing life of the mold, seal for cooling water at the joined portion deteriorates sooner. In a case where the water leakage should occur by the failure of the pressing cylinder, intrusion of obstacles or degradation of the seal, this brings about seizure of the copper plate and, depending on the case, inflow of a great amount of water into the mold to possibly cause a worry of steam explosion.

DISCLOSURE OF THE INVENTION

This invention intends to solve the foregoing problems and provide a method of exchanging, in-situ the entire shorter side frame, that is, the variable frame corresponding portion (copper plate) and the stationary frame corresponding portion (back frame) integrally without dividing them. Further, it intends to provide a shorter side frame with improved attaching/detaching mechanism relative to the moving device in order to attain the method, as well as a casting mold using such a shorter side frame.

In accordance with this invention, the above mentioned object is attained by constituting a connection portion between a shorter side frame of a continuous casting mold and a moving device for changing the width of the shorter side frame (stepping cylinder or the like) with a concave shape structure and inserting a fixing jig (particularly, a fixing jig capable of inserting from the upper end side of the mold) thereby joining to fix the moving device and the shorter side frame.

That is, this invention provides a continuous casting mold comprising a pair of longer side frames in which at least one of them is movable in a forward-to-backward direction, a pair of shorter side frames put between the pair of longer side frames and movable in the forward-to-backward direction and, a pair of moving devices for moving each of the shorter side frames in the forward-to-backward direction respectively in which the shorter side frames and the moving devices for moving the same are engaged respectively by way of one or more of attaching/detaching mechanisms disposed at the back of the shorter side frame, the attaching/detaching mechanism has a concave forming portion having a concave portion engaging a portion of the moving device, and at least one of the attaching/detaching mechanisms has a fixing jig for fixing the portion of the moving device to the concave forming portion on every shorter side frame. Referring to the forward-to-backward direction, it is defined that the side of the cast piece in each frame is defined as a forward direction and the side on the rear face of the frame is defined as the backward direction.

In this case, a constitution in which the concave forming portion has a downwarded opening portion, and the fixing jig is a bolt screw passing from above through the back of the concave forming portion and at least a portion of the moving device is particularly preferred. Further, it is preferred that the gap of the walls of the concave forming portion sandwiching a portion of the moving device is made larger by 0.1 to 0.4 mm (preferably, 0.1 to 0.2 mm) than the size for the portion of the moving device. Further, it is also preferred that the portion of the moving device fixed to the concave portion of a attaching/detaching mechanism having the fixing jig has a substantially square cylindrical shape (square pin shape).

Further, in the structure of the attaching/detaching mechanism, the opening of the concave forming portion is directed to the back of the shorter side frame, a portion of the lower wall of the concave forming portion is opened and, further, the fixing jig is a cotter inserted from above.

In any of the embodiments described above, it is preferred that the shorter side frame has cooling water channels at the inside of the integrated frame.

Further, this invention provides a shorter side frame constituting a mold for use in continuous casting, comprising one or more of attaching/detaching mechanisms to engage a moving device for moving the shorter side frame in a forward-to-backward direction at the back of the shorter side frame, in which the attaching/detaching mechanism has a concave forming portion having a concave portion in engagement with a portion of the moving device and at least one of the attaching/detaching mechanisms has a fixing jig for fixing the portion of the moving device to the concave forming portion. Preferred embodiments for the shorter side frame, the attaching/detaching mechanism and the like are identical with those in the invention for the casting mold.

This invention further provides a method of exchanging, in-situ, a pair of engaged shorter side frames (referred to as A) with another pair of shorter side frames (referred to as B) in a continuous casting mold having a pair of longer side frames in which at least one of them is movable in a forward-to-backward direction, a pair of shorter side frames put between the pair of the longer side frames and movable in the forward-to-backward direction and moving devices engaged by way of one or more of attachment/detachment mechanisms disposed respectively to the shorter side frame for moving the shorter side frames respectively in the forward-to-backward direction wherein the method comprises, a step of once stopping casting, a step of moving the shorter side frames A by the moving devices in the backward direction and stopping the same at predetermined exchange positions respectively, a step of moving at least one of the longer side frames to an aimed position in a forward-to-backward direction thereby setting an aimed slab thickness, a step of releasing the attaching/detaching mechanisms for the shorter side frames A respectively to detach the entire shorter side frames A from the moving devices by the attaching/detaching mechanisms respectively, a step of engaging the entire shorter side frames B having a width corresponding to the aimed slab thickness to the moving devices by way of the attaching/detaching mechanisms for the shorter side frames B respectively, a step of moving the shorter side frames B by the moving devices respectively in the forward direction thereby setting a predetermined slab width and a step of starting casting again. The timing for the movement of the longer side frame may be set properly depending, for example, on whether the thickness of the slab is changed in the increasing direction, or in the narrowing direction toward the reducing direction, or the movement may of course be conducted for several times.

In this case, it is preferred that the method further includes, in addition to the step described above, a step of stopping the supply of cooling water to the shorter side frames A respectively before detaching the shorter side frames A from the moving devices, and detaching the supply pipes for cooling water to the shorter side frames A from the shorter side frames A respectively and further includes a step of connecting the cooling water supply pipes to the shorter side frames B respectively after engagement of the shorter side frames B to the moving devices, and starting supply of cooling water to the shorter side frames B respectively.

According to this invention, in the continuous casting mold, the copper plate and the back frame of the shorter side frame can be exchanged in-situ easily while leaving them integrally as it is. Accordingly, for changing the thickness of the cast piece, since the shorter side frame can be exchanged on-line in a short period of time, on-line change of the cast piece thickness is possible.

Figure 1:
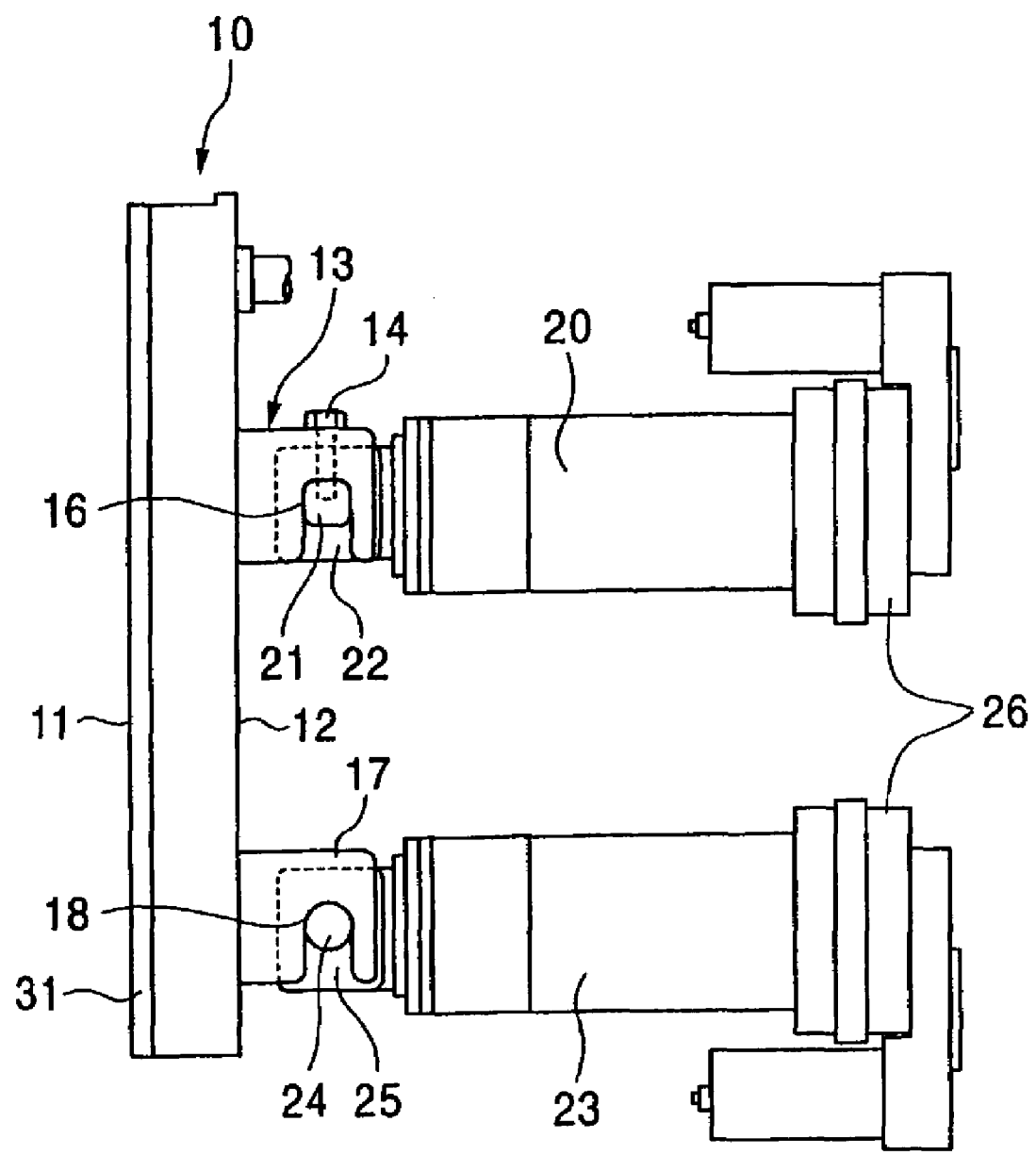
FIG. 1 is a side elevational view of a first embodiment according to this invention.

1 mold
2 longer side frames
2*a* longer side frame (stationary side)
2*b* longer side frame (movable side)

3 longer side frame moving device
4 rod
5 worm jack
10, 10a, 10b, 10', 10a' shorter side frame
11 surface of the shorter side frame
12 rear face of the shorter side frame
13, 13' attaching/detaching mechanism (upper side)
14, 14a bolt (fixing jig)
15, 15' concave forming portion (upper side)
16, 16' concave portion (upper side)
17, 17b concave forming portion (attaching/detaching mechanism) (lower side)
18 concave portion (lower side)
19, 19a cotter. (fixing jig)
20 stepping cylinder (upper side)
21, 21' rod top end pin (upper side)
22 rod (upper side)
23 stepping cylinder (lower side)
24 rod top end pin (lower side)
25 rod (lower side)
26, 26' moving device
27 bolt hole
27a bolt hole (concave forming portion)
27b bolt hole (rod top pin)
28 mold frame upper end face
31 mold copper plate
32 cooling water channel (on the side of the copper plate)
33 cooling water channel (on the rear side)
34 mold cooling water supply hose
35 coupling (for mold cooling water supply)
36 spray cooling water (Water for cooling cast slab by spraying) supply hose
37 coupling (for spray cooling water supply)
38 spray type cooling device
39 foot roll (support roll)
41 mold movable cover
42 mold stationary cover
43 cooling water channel (for spray cooling water)
44 mold cooling water discharge hose
45 coupling (for mold cooling water discharge)
46 cooling water supply port (for mold cooling water)
47 cooling water supply port (for spray cooling water)
48 cooling water discharge port (for mold cooling water)
50–54 arrow (indicating movement)
60 water flow (mold cooling water)
61 water flow (spray cooling water)
70 opening (for mold cooling water supply)
71 opening (for mold cooling water discharge)
72 opening (for spray cooling water supply)
73 pipe (for supplying mold cooling water to the side of copper plate)
74 opening portion (for supplying spray cooling water) a mold thickness

BEST MODE FOR PRACTICING THE INVENTION

Figure 2:
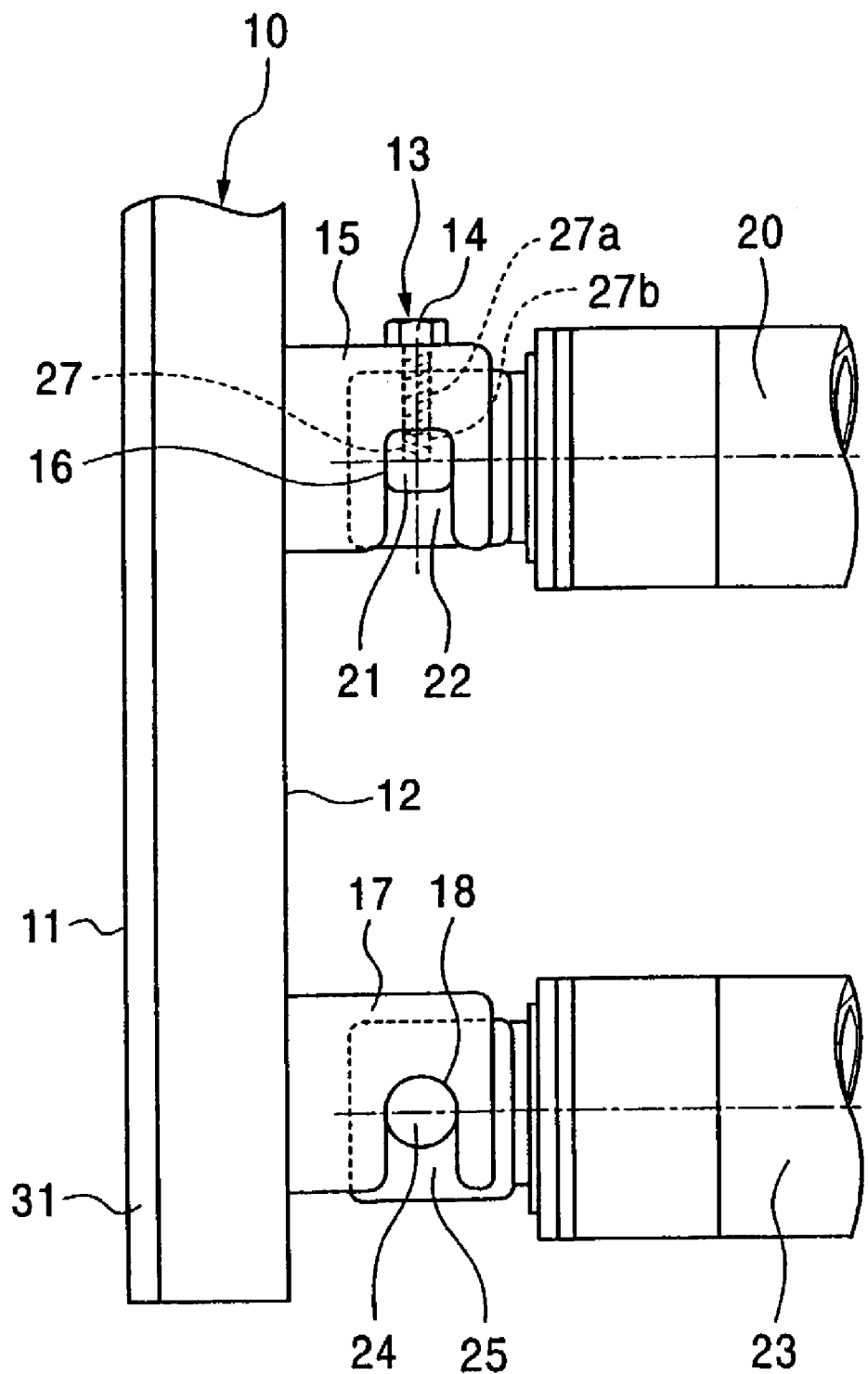
FIG. 2 is an enlarged view for an attaching/detaching mechanism in the first embodiment according to this invention.
Figure 3:
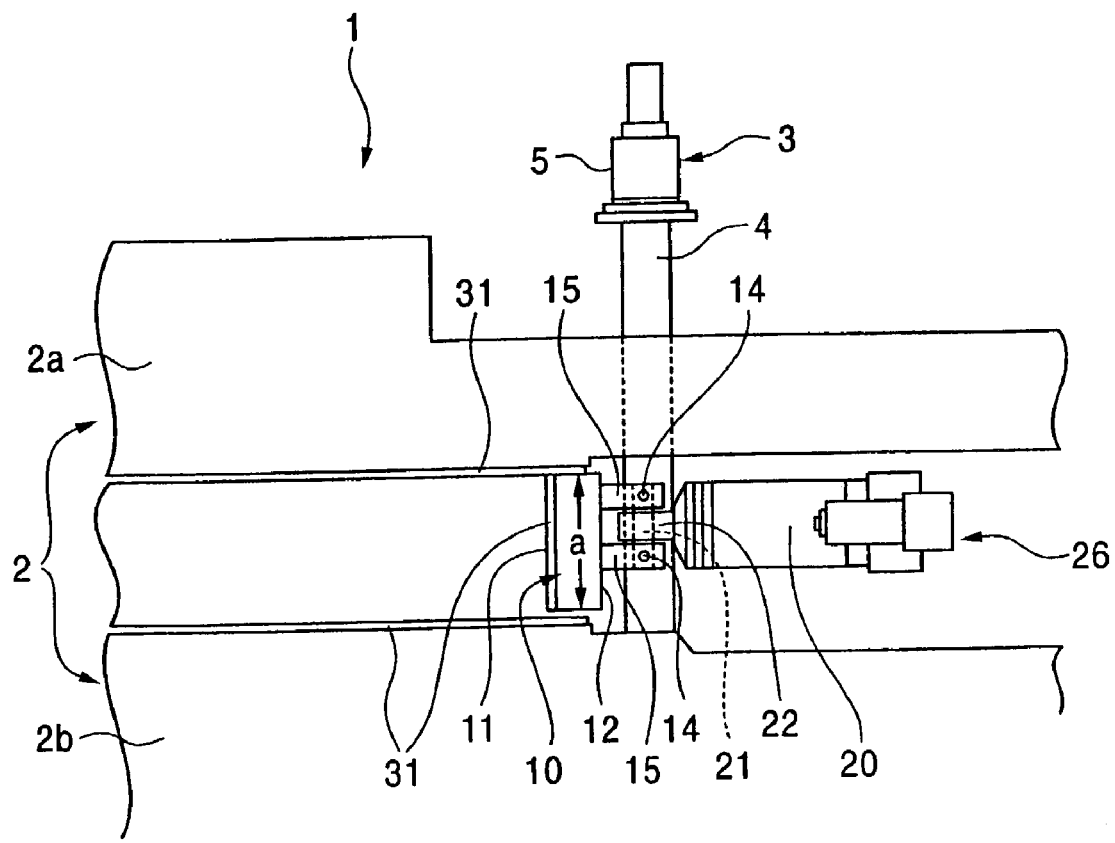
FIG. 3 is a plan view of a first embodiment according to this invention.
Figure 4:
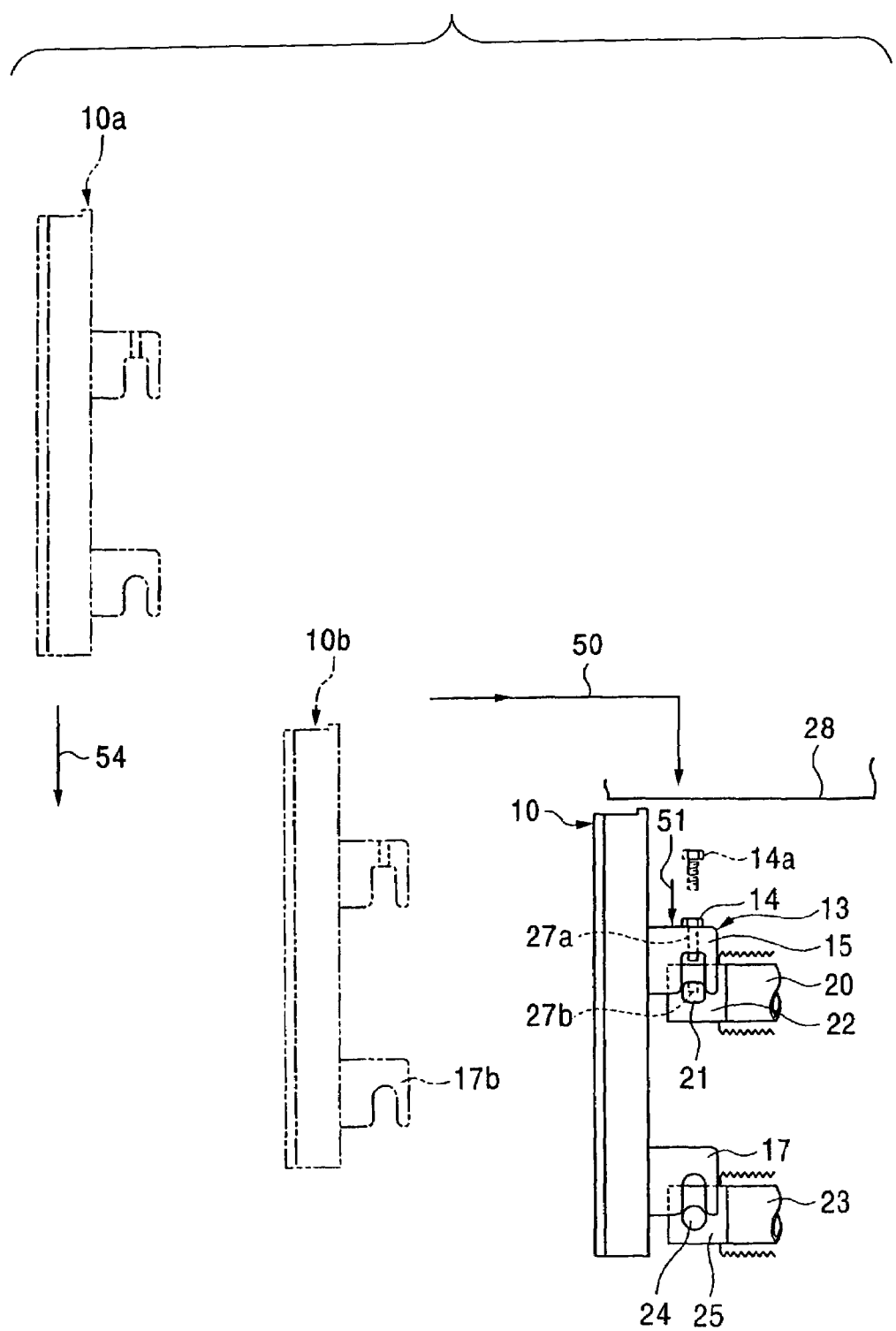
FIG. 4 is an explanatory view for the attaching operation of a shorter side frame in the first embodiment according to this invention.
Figure 5:
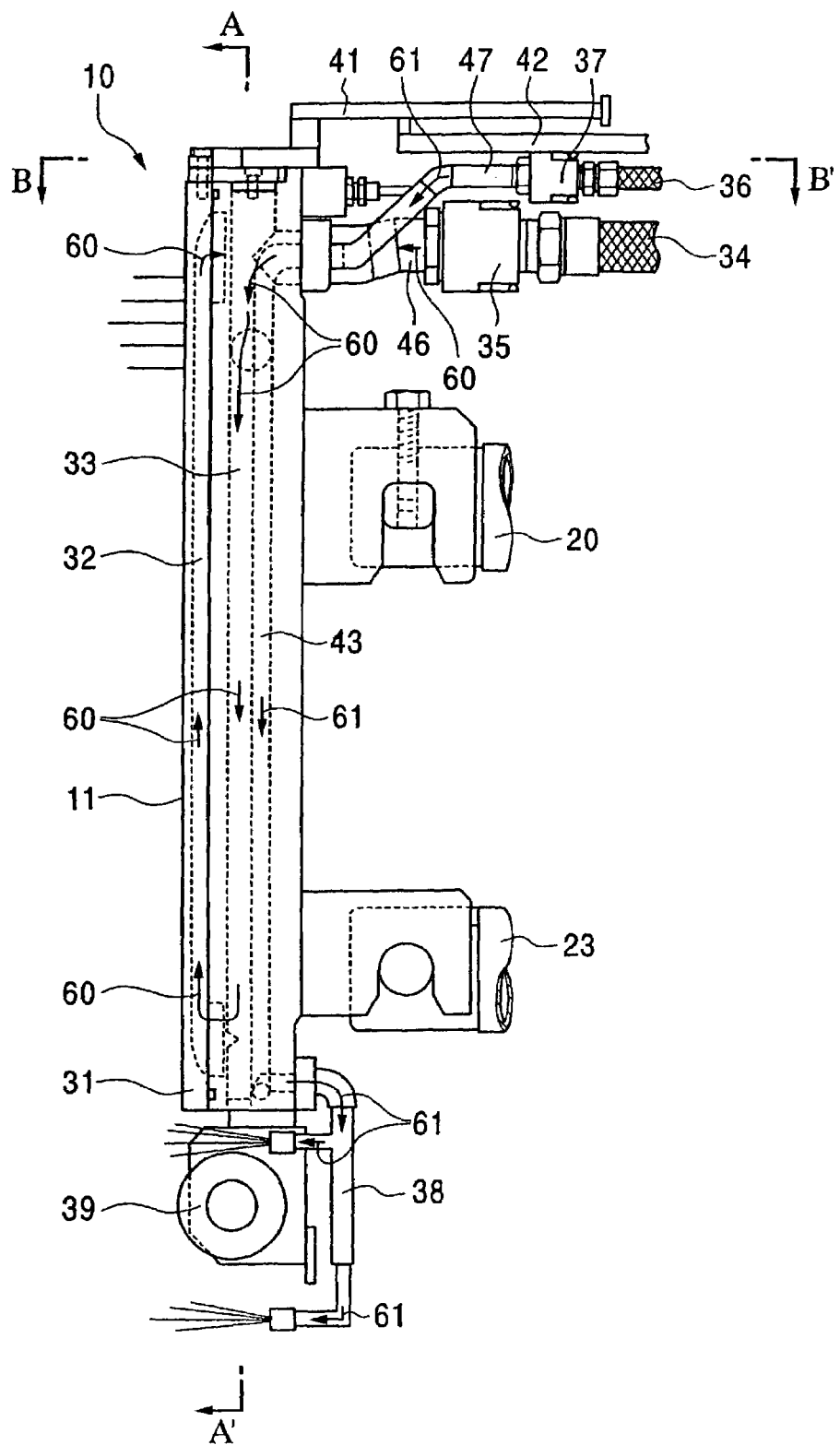
FIG. 5 is a detailed view (side elevational view) for pipe installation in the first embodiment according to this invention.
Figure 6:
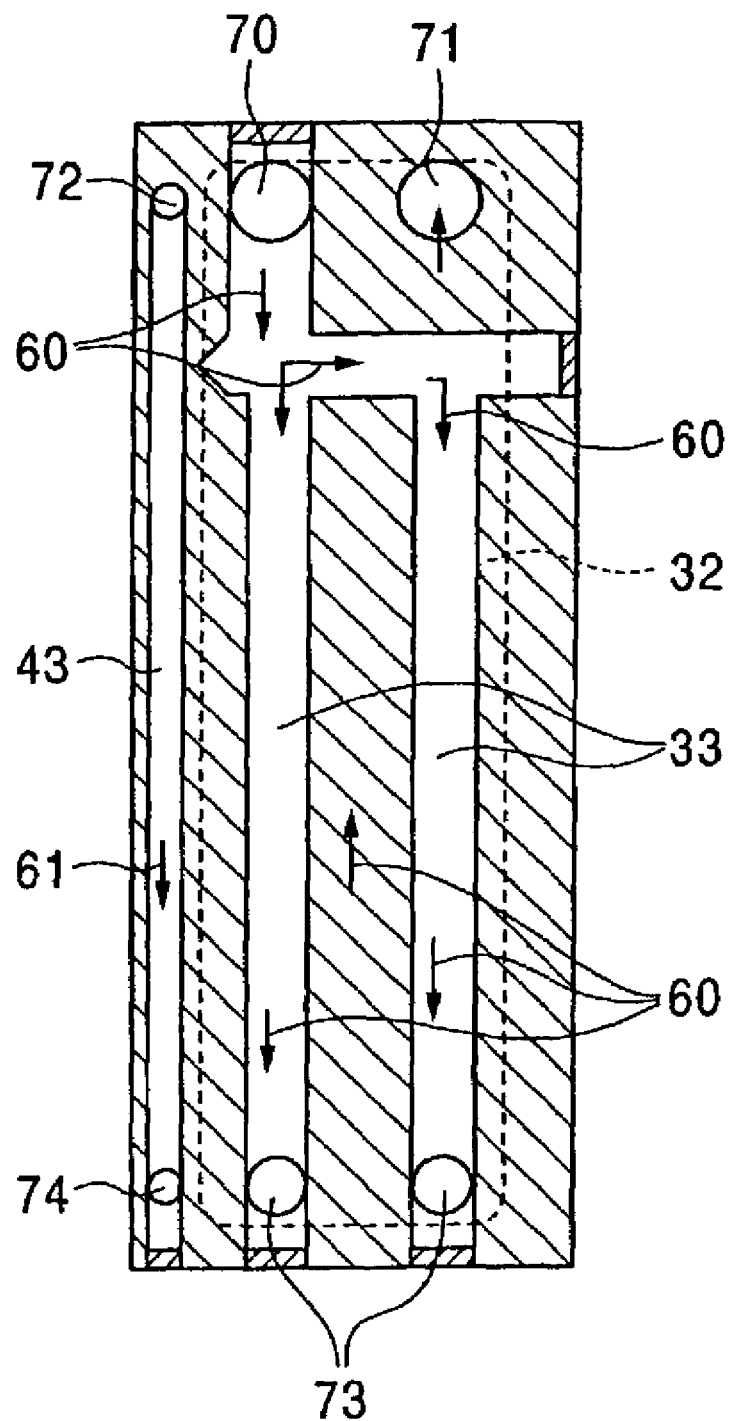
FIG. 6 is a detailed view (cross sectional view as viewed from the back of the shorter side frame) for pipe installation in the first embodiment according to this invention.
Figure 7:
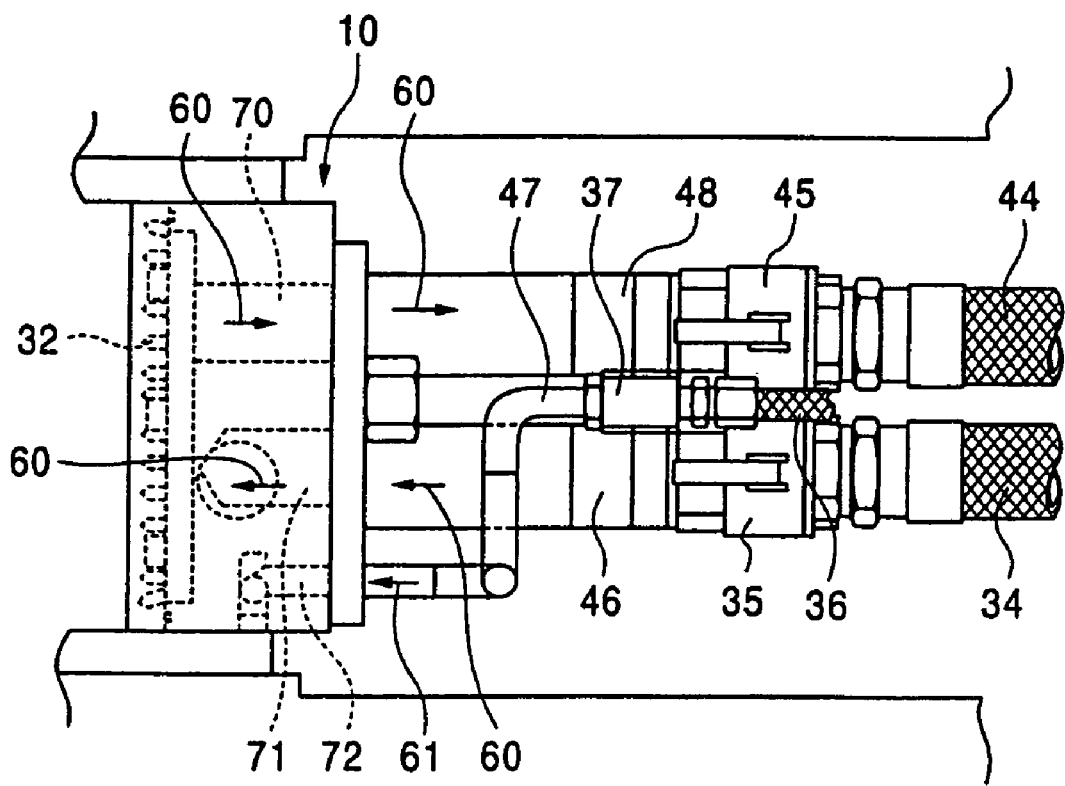
FIG. 7 is a detailed view (plan view) for pipe installation in the first embodiment according to this invention.

FIG. 1 to FIG. 7 show a first preferred embodiment according to this invention. FIG. 1 is a side elevational view for the first embodiment, FIG. 2 is an enlarged view for an attaching/detaching mechanism, FIG. 3 is a plan view showing the first embodiment, FIG. 4 is an explanatory view showing the attaching operation thereof and FIG. 5 to FIG. 7 are detailed views showing the connection of water cooling pipes A continuous casting mold 1 has, for example, as shown in FIG. 3, a pair of longer side frames 2 comprising a stationary side 2a and a movable side 2b, which are clamped by way of shorter side frames 10 put therebetween to form a space of a rectangular cross section, and molten metal is poured from a portion thereabove and a slab is drawn downwardly to conduct continuous casting. The surface 11 of the shorter side frame is defined as a casting side and the rear side 12 is defined as an opposite side. In each of the frames, a copper plate 31 for cooling is disposed on the side of the cast piece.

As shown in FIG. 1 to FIG. 3, a moving device 26 has an upper stepping cylinder 20, a rod (upper rod) 22 as a movable part of the upper stepping cylinder 20, an (upper) rod top end pin 21 situated at the top end of the upper rod 22, a lower stepping cylinder 23, a rod (lower rod) 25 as a movable part of the lower stepping cylinder 23, a (lower) rod top end pin 24 situated at the top end of the lower rod 25.

In this embodiment, the rod top end pins 21 and 24 correspond to a portion of the moving device (it is not necessarily a top end but hereinafter also referred to as a top end portion of the moving device for the simplicity) to be engaged to a concave forming portion of an attaching/detaching mechanism to be described later. In this embodiment, the upper top end pin 21 is made into a substantially square cylindrical shape for the engaging portion with the shorter side frame and into a substantially circular cylindrical shape for the connection portion with the rod 22. Further, the lower top end pin is formed into a substantially circular cylindrical shape.

During continuous casting, the position for the shorter side frame 10 can be changed by loosening the clamping for the longer side frame 2 and advancing or retracting the stepping cylinders 20, 23 to change the width of the slab.

On the other hand, the thickness of the slab is changed, for example, by the following procedures. Referring to an example of FIG. 3, one of the longer side frames (movable side 2b) is joined by way of a rod 4 passing through the other of the frames (stationary side 2a) to a worm jack 5. The movable side longer frame 2b moves forward and backward by a longer frame moving device 3 comprising the worm jack 5 and the rod 4 to change the thickness for the cross section of the mold space. At the same time, the shorter frame 10 is replaced with another shorter frame of different width. In this invention, exchange of the shorter frame 10 can be conducted on-line in which an upper attaching/detaching mechanism 13 and a concave forming portion (lower side) 17 constituting the lower attaching/detaching mechanism are disposed at the back 12 of the shorter frame 10.

As shown in FIG. 2 in an enlarged scale, the upper attaching/detaching mechanism 13 comprises a concave forming portion 15 having a concave portion 16 and a bolt 14 as a fixing jig. The concave forming portion 15 is attached with the opening being downwarded to the shorter side frame and the concave forming portion has a shape capable of engaging the upper rod top end pin 21 by the concave portion 16.

The bolt 14 passes through at least a portion of the top end pin 21 from the back part (upper) of the concave forming portion 15 along a bolt hole 27, thereby fixing the top end pin 21 to the concave forming portion. By the use of the bolt as a fixing jig, an operation space required for the fixing operation by the fixing jig can be made extremely small.

The bolt hole 27a apertured in the concave forming portion 15 is made somewhat larger than the bolt diameter. A preferred bolt hole size is about bolt diameter +0.1 to 0.2 mm. Further, the threads corresponding to the threads of the bolt are formed only to the bolt hole 27b apertured in the top end pin. The bolt hole 27b may penetrate the top end pin.

The concave portion 16 preferably has a substantially identical shape with that of the pin to be engaged (to such an extent as capable of attaching and detaching). It is preferred in this embodiment to define such shape and size as forming a gap of 0.1 mm or more in total between the wall of the concave forming portion 15 and the pin 21 when they are engaged. This is because powdery matters or the like are scattered and suspended at the periphery of a continuous casting facility as described above and, unless the gap is disposed, a difficulty may be possibly caused for the attachment/detachment when the powder should intrude into the concave portion.

When the gap is excessively large, positioning of the fixing jig (positioning for the bolt hole in this case) is complicated and also it tends to cause rattling. Consequently the upper limit for the gap is set to about 0.4 mm, preferably, about 0.2 mm. Conversely, when the upper limit of the gap is 0.4 mm or less, centering is facilitated upon insertion of the bolt 14 through the bolt hole 27a provided with the margin as described above.

In this embodiment, it is preferred that the top end portion of the moving device fixed by the fixing jig has a substantially square pin-like cross sectional shape (substantially square cylindrical shape). This is due to the following reasons.

One of the reasons is that fixing by the bolt screw is more reliable in the case of the square cylindrical shape compared with the case of the circular cylindrical shape.

Another reason is that the positioning function is improved. It is preferred that at least one of the attaching/detaching mechanisms also has a function of vertical positioning for the shorter frame and it is preferred that the attaching/detaching mechanism having the fixing jig is provided with the function of the vertical positioning (since the portion fixed to the fixing jig is least moveable). For the purpose of vertical positioning, the contact portion between the concave portion and at least the upper surface of the top end pin is preferably planer. On the other hand, for providing also the function of forward-to-backward positioning (forward-to-backward direction of the shorter frame) with such a shape, it is preferred that the shape is planar also in the forward-to-backward direction. Accordingly, the square cylindrical shape is a most simple shape for satisfying the preferred conditions described above. Each of the corners for the square cylinder may be chamfered with no problems.

In a case of adopting the top end of the generally square cylindrical shape, since it particularly tends to undergo the undesired effect of scattered powder, it is strongly recommended to ensure the gap.

With a view point of workability, it is preferred to attach a pin of a generally circular cylindrical shape to the top end of the rod and, subsequently, fabricating the engaging portion with the shorter frame into a generally square cylindrical shape. Accordingly, the joined portion with the rod may be of a generally cylindrical shape.

The lower attaching/detaching mechanism substantially comprises only the concaved forming portion 17 (with downwarded opening). In a case of this embodiment using a generally square cylindrical pin as the top end for engagement with the upper attaching/detaching mechanism having the fixing jig, it is preferred that the top end of the lower moving device is a pin of a generally circular cylindrical shape and the concave portion 18 is a U-shaped groove (the bottom of the indent has a substantially semi-circular sectional shape). The constitution described above is desirable because in the non-fixed type attaching/detaching mechanism (attaching/detaching mechanism having no fixing jig), positioning (preference being given, particularly, to positioning accuracy in the forward-to-backward direction) is facilitated and the positional accuracy in the forward-to-backward direction is not deteriorated so much when scattered powder or the like is involved.

FIG. 4 is an explanatory view for the attachment of the shorter frame 10. A shorter frame 10a shown by an imaginary line is lowered as shown by an arrow 54 such that the lower concave forming portion 17b situates between the upper and lower rods 22 and 25 (that is, to a position not interfering the rods) (10b). Subsequently, after moving the shorter side frame 10b rightwardly as shown by an arrow 50, it is moved downwardly and the upper and lower moving device top end portions (pins) 21, 24 are engaged with and attached to the upper and the lower attaching/detaching mechanisms 13, 17 respectively.

In FIG. 4, an upper end face position 28 for the mold frame is shown for the reference.

In this case, it is preferred that the rod top end pin 21 of the upper stepping cylinder 20 and the rod top end pin 24 of the lower stepping cylinder 23 are situated each at a position advanced from the limit position for the retracting stroke of the stepping cylinder to such an extent as capable of ensuring the operationability. In this embodiment, they were advanced each from the retraction limit by 200 mm. It is preferred that both of the upper and lower pins are stopped generally at an identical position (for the forward-to-backward direction of the shorter side frame).

After engaging the upper and the lower top end portions (top end pins) to respective concave forming portions 15, 17 of the upper and the lower attaching/detaching mechanisms, the bolt 14a is passed from above as shown by an arrow 51 through bolt holes 27a and 27b formed to the upper attaching/detaching mechanism and the upper top end portion engaged therewith respectively and the bolt 14 is clamped. The bolt 14 may be clamped manually or clamped by using a machine. After attaching the shorter side frame, a cooling water piping to be described later is connected optionally to flow a cooling water and then the shorter frame is moved till the casting position (aimed lateral position of slab) in the forward-to-backward direction of the shorter side frame.

Upon detaching the shorter side frame, the procedures are reversed. That is, the shorter side frame is moved at first in the forward-to-backward direction to a position suitable to exchange and stopped at that position. Successively, optional cooling water is stopped and the cooling water piping is detached. Subsequently, the bolt is loosened and removed and then the shorter side frame may be moved and pulled up in the direction opposite to the arrows 50 and 54.

Movement of the shorter side frame upon attaching or detaching is not necessarily restricted to the method described above so long as it can move with no interference to the longer side frame or the moving device (stepping cylinder in this embodiment) and it may also include movement, for example, in the oblique direction.

As a matter of course, upon attaching or detaching the shorter side frame, it is necessary that the distance between the longer side frames is made larger than the thickness a (refer to FIG. 3) of the shorter side frame by the moving device for the longer side frame (worm jack in this embodiment) 3. After the exchanging operation for the shorter side frame, the shorter side frame is sandwiched by a predetermined force by the moving device 3.

With the structure and procedures described above, the shorter side frame can be integrally attached or detached extremely simply and the shorter side can be changed on-line.

FIG. 5 is a side elevational view for showing attachment and detachment of a cooling water pipes, and FIG. 6 is a cross sectional view taken along a plane A–A' as viewed from the back of the shorter side of the frame. Further, FIG. 7 is a plan view taken along a plane B–B' in FIG. 5 from above. The shorter side frame 10 has a mold copper plate 31 on the surface 11 and has a cooling water channel 32 on the side of the copper plate between the copper plate 31 and the frame main body. Further, it also has a rear side water channel 33 for supplying cooling water to the cooling water channel 32 in the inside of the frame.

The cooling water channel 32 on the side of the copper plate is preferably formed as a plurality of grooves to the copper plate as shown in FIG. 7 (in FIG. 6, front elevational view, only the outer edge is shown with no details) but it is not restrictive. The water channels 33 at the back are disposed by the number of two in this embodiment but the number is not restricted particularly so long as a required water flow rate can be ensured.

When the shorter side frame is attached, a mold cooling water supply hose 34 is attached to a mold cooling water supply port 46 by a coupling 35, and a mold cooling water discharge hose 44 is attached to a mold cooling water discharge port 48 by a coupling 45 thereby connecting cooling pipe. Then, supply of the cooling water is started.

The supplied cooling water passes through a mold cooling water supply opening 70 and through the cooling water channels 33 at the back and enters by way of pipe 73 (mold cooling water supply pipe on the side of the copper plate) in the lower portion of the frame into the cooling water channels 32 as water flow of mold shown by an arrow 60 in FIG. 5 to FIG. 7. Cooling water entering to the copper plate flows upwardly in the cooling water channels 32 on the side of the copper plate and then discharged through the mold cooling water discharge opening 71 into the discharge hose 44.

On the other hand, when the shorter side frame is detached, after stopping the supply of cooling water, the coupling 35 for the mold cooling water supply hose 34 is detached from the cooling water supply port 46 and, in the same manner, the coupling 45 for the mold cooling water discharge hose 44 is detached from the cooling water discharge port 48.

The cooling water supply hose 34 and the discharge hose 44 may be attached or detached manually or mechanically and there is no restriction for the order thereof. Although not illustrated particularly, the cooling water supply mechanism may be a general equipment.

The spray cooling water channel 43 for cooling the lateral surface of the continuously cast slab may sometimes be disposed to the shorter side frame. Also in this case, the spray cooling water hose 36 may be attached or detached by way of the coupling 37 to the spray cooling water supply port 47 in the same manner. The timing for attachment and detachment, as well as supply and stop of cooling water may be identical with that for cooling water for the frame.

The stream of the spray cooling water upon connection flows through a spray cooling water supply opening 72 into the water channels (which may also be pipeline) in the shorter side frame and by way of an opening 74 for the spray cooling water spray supply in the lower portion of the shorter side ladle frame to a spray type cooling device 38 as shown by an arrow 61 (spray cooling water flow) in FIG. 5 to FIG. 7.

As has been described above according to this invention, since the cooling water seal for the short side frame is not attached or detached upon attachment and detachment of the cooling water piping, no particular consideration is required for the seal leakage upon exchange of the shorter side frame, and the seal can be always kept intact. Further, the operation for attaching·detaching the cooling water piping is also simple.

In FIG. 5, 39 denotes a foot roll (support roll for preventing bulging or the like), which is preferably disposed to the shorter side frame in view of smooth continuous casting.

Further, for preventing heat dissipation of molten steel form the upper surface of the mold (prevention of temperature lowering) and preventing intrusion of obstacles such as powder for continuous casting, a mold stationary cover 42 and a mold movable cover 41 may sometimes be disposed aside above the shorter side frame, and they sometimes interfere the carrying space for the exchange of the shorter side frame. In this case, the movable cover 41 may be once detached before the exchange of the shorter side frame and attached again after the completion of exchange. It is not usually necessary to detach the stationary cover 42 entirely but the cover plate in the upper portion may be displaced as required.

Figure 8:
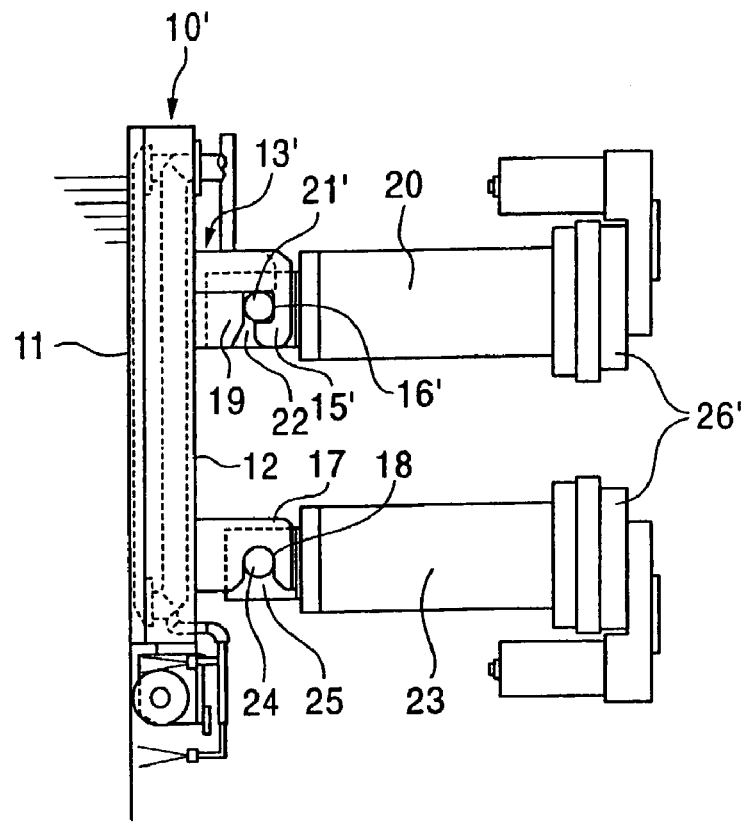
FIG. 8 is a side elevational view of a second embodiment according to this invention.
Figure 9:
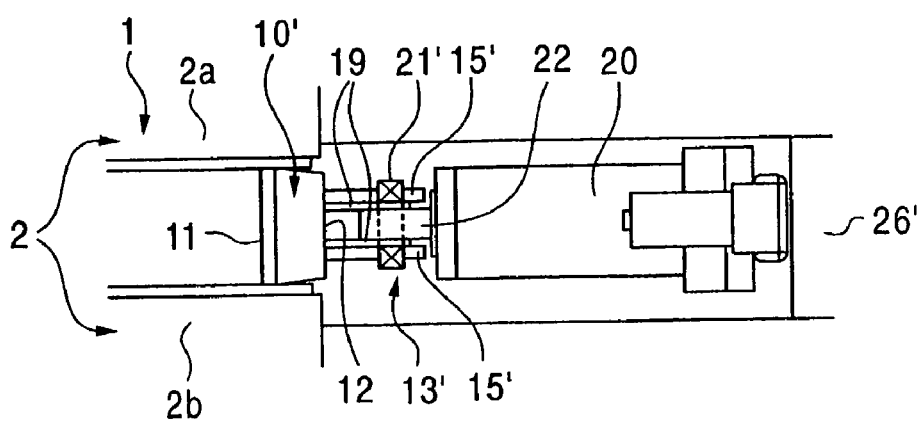
FIG. 9 is a plan view of the second embodiment according to this invention.
Figure 10:
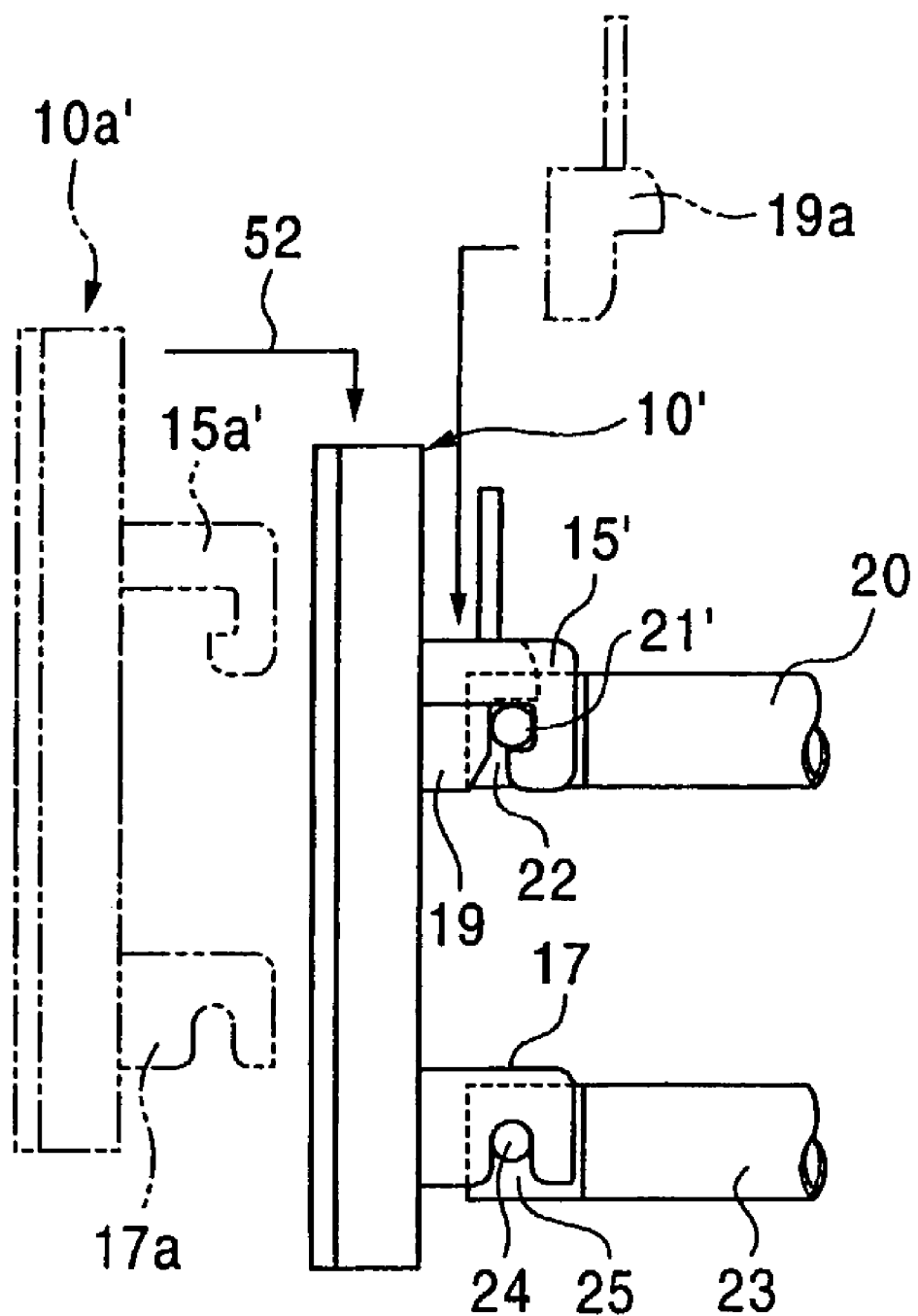
FIG. 10 is an explanatory view for the attaching operation of a shorter side frame in the second embodiment according to this invention.
Figure 11:
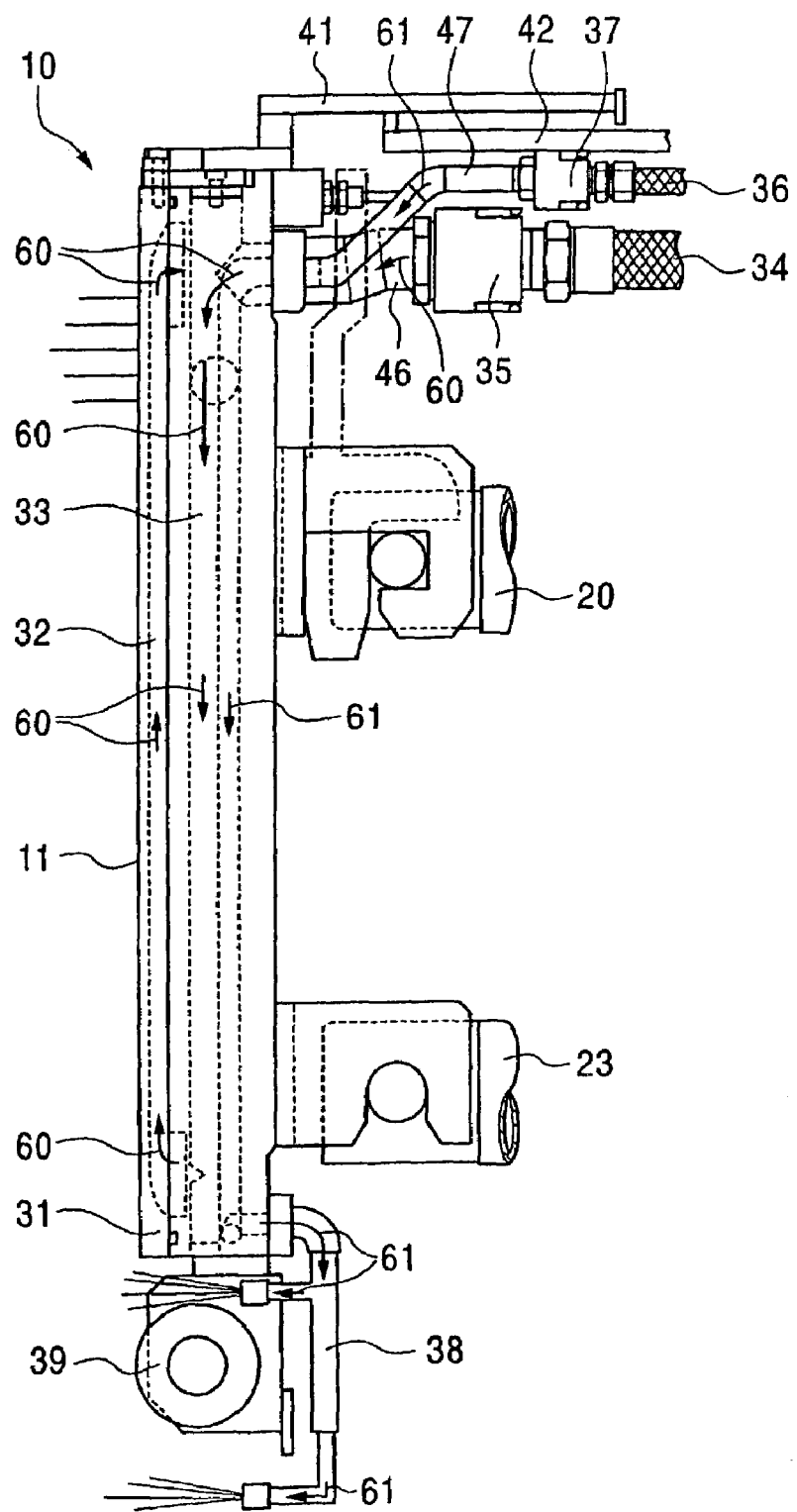
FIG. 11 is a detailed view (side elevational view) for pipe installation in the second embodiment according to this invention.

FIG. 8 to FIG. 11 show a second preferred embodiment according to this invention. FIG. 8 is a side elevational view of the second embodiment, FIG. 9 is a planer view thereof, FIG. 10 is an explanatory view showing the attaching operation thereof and FIG. 11 is a detailed view (side elevational view) showing the connection of water cooling pipings.

Continuous casting mold 1, a pair of longer side frames 2, a moving device 26' and the like are identical with those in the first embodiment excepting for the shape of the top end portion (pin) 21' of the upper moving device. Further, also the shorter side frame 10' is identical with that of the first embodiment except for the structure of the upper attaching/detaching mechanism 13' (FIG. 8, FIG. 9).

As can be seen from FIG. 8, in this embodiment, the opening of the concave forming portion 15' in, the attaching/detaching mechanism 13', is directed to the rear face 12 of the shorter side frame 10', and a portion of the lower wall of the concave forming portion 15' is opened and, further, the fixing jig is a cotter 19 inserted from above.

In other words, it may be said that the concave forming portion 15' has a shape comprising a horizontal protrusion, a suspended portion at the top end thereof and a short horizontal turn-back at the lower end of the suspended portion. Further, the shape may also be expressed as a downwardly opened hook, a cramp-shaped configuration with shorter lower side, or a J-shaped configuration (which may be angled).

The top end pin 21' is engaged to the concave portion 16' at the bottom of the hook. That is, the rod top end pin 21'a is engaged in such a manner that it is embraced to the inside of the shorter side of the cramp-shaped configuration.

Then, a cotter 19 is inserted between the rod top end pin 21' engaged to the inside of the shorter lower side of the cramp-shaped configuration and the rear face 12 of the shorter side frame 10' to prevent detachment between the pin and the hook (that is, the pin is fixed to the concave forming portion 15').

The cotter is vertically movable, has a taper on the lateral surface for inserting and detaching from above and it is inserted by being enforced downward between the rod top end pin 21' and the rear face 12 of the shorter side frame 10', to fix the rod top end pin 21' to the concave forming portion 15'.

It is preferred that the rod top end pin 21' is of a substantially circular cylindrical shape in view of the operability of the engaging operation but a portion thereof in contact with the cotter 19 is preferably formed into a square cross sectional shape so as to be well fitted with the cotter 19. A handle or attaching tool not illustrated is preferably attached to the cotter 19 so that it is inserted or detached manually.

FIG. 10 is an explanatory view for the attachment of the shorter side frame 10'. In the same manner as for the first embodiment, after positioning such that the lower concave forming portion 17a situates between the upper and lower rods 22 and 25 (10a') (drawing before lowering is not shown), the shorter frame 10a' is moved rightwardly and then downwardly as shown in arrow 52 and then upper and lower moving device top ends (pins) 21', 24 are engaged with and attached to the upper and the lower attaching/detaching mechanisms 13', 17 respectively.

Upon preceding positioning for the top end pin, the rod top end pin 21' of the upper stepping cylinder 20 is stopped at a position advanced slightly from the rod top end pin 24 of the lower stepping cylinder 23 and, when the lower rod top end pin 24 engages the concave forming portion 17 of the lower attaching/detaching mechanism, the rod top end pin 21' of the upper stepping cylinder is retracted. Then, the pin 21' is embraced inside of the hook-shaped concave forming portion 15'. Then, the cotter 19a is inserted from above as shown by an arrow 53. When the inserted cotter 19 is pressed down, fixing between the pin and the hook is completed.

When the shorter side frame 10' is detached, the procedures described above may be reversed. In this case, after removing the cotter 19 upwardly, the upper rod top end pin 21' is advanced slightly by which the detaching operation in the upper attaching/detaching mechanism proceeds smoothly.

Accordingly, also in this embodiment, the shorter side frame can be attached or detached quite simply, and the shorter side frame can be exchanged on-line.

FIG. 11 shows attachment and detachment of cooling water pipings. The constitution for each of the portions regarding attachment and detachment of the cooling water pipings is identical with that of the first embodiment and the attaching and detaching procedures are also identical.

Also in this second embodiment, since the cooling water seal for the shorter side frame is not detached or attached by attachment and detachment of the cooling water pipings upon exchange of the shorter side frame, no particular consideration is required upon exchange of the shorter side frame and the seal is always kept intact.

The two embodiments have been described as above but the invention is not restricted thereto.

For example, it is not always necessary to adapt the stepping cylinder as the moving device for the shorter side frame but an ordinary hydraulic cylinder (positional detection is conducted, for example, by a combination of a guide rod and a positional sensor), a worm jack and a hydraulic motor (positional detection is conducted, for example, by a rotation detection device) or a silnuck cylinder can be used. However, the stepping cylinder is particularly preferred since the positioning accuracy is high. Further, each of the devices described above can be used also as the moving device of the longer side frame and the worm jack is suitable in view of installation and operation space or power.

Further, while two stepping cylinders consisting of upper and lower stepping cylinder have been adopted as the moving device, the number of the moving mechanisms such as the stepping cylinders has no particular restriction. However, upon change of the slab width during continuous casting, it is preferred to gradually change the thickness by once tilting the shorter side frame and, for this purpose, it is preferred that at least two (upper and lower) moving mechanisms are provided. On the other hand, there is no substantial merit of disposing them by the number of three or more, the moving device is preferably disposed by the number of two in view of the cost excepting for a case, for example, where the weight of the shorter side frame is particularly heavy. Accordingly, it is also preferred that the attaching/detaching mechanisms are disposed at two positions that is upper and lower position.

Upon engagement with two or more moving mechanisms, the fixing jig may be disposed to any of the attaching/detaching mechanisms. However, it is generally preferred to provide the fixing jig to the attaching/detaching mechanism situated to the upper position in view of the operability and easy confirmation.

Further, with a view point of the operability, the fixing jig is preferably disposed by one to each of the shorter side frames but it may naturally disposed two or more attaching/detaching mechanisms.

The attaching/detaching mechanism to which the fixing jig is disposed may be any mechanism not being restricted to the example described above. For example, an engaging method of sandwiching the moving device top end (pin) may be used. However, it is preferred to be based on the shape of the hook which engages the top end since this facilitates compatibility between the attaching and detaching operability and the fixing performance. As a variation for the hook-shaped form, it may be considered a method of forming openings of the J-shaped configuration in different upper and lower directions between right and left sides in the second embodiment and moving the pin to the engaging position by the rotation of the rod. However, the first and the second embodiments are superior in view of the operability.

For the fixing jig, a key, or a usual wedge, latch or a combination thereof (for example, wedge and bolt) may be considered in addition to the example described above. It is preferred that the fixing jig of a type to be inserted from above with a view point of the operability and the confirmation of the fixing state.

The attaching/detaching mechanism not provided with the fixing jig preferably has a downwarded concave forming portion simply in view of the operability and the cost, with no particular restriction thereto. For example, attachment and detachment are possible by the mechanism having a concave forming portion in the forward-to-backward direction of the shorter side frame. However, when the concave forming portion is disposed in the forward-to-backward direction, since large force exerts in the forward-to-backward direction, for example, in a case of changing the width of the cast piece during casting, the fixing jig (of attaching/detaching mechanism with fixing jig) suffers from a burden to require a strength for the fixing tool. Therefore, the downwarded concave forming portion is most preferred.

The top end of the moving device for engagement with the attaching/detaching mechanism is not restricted to the pin as described above, but a recess may be formed directly to the rod top end so that the attaching/detaching mechanism sandwiches the recess. However, the pin is most preferred in view of easy fixing and strength.

The shorter side frame may be provided with other auxiliary facility useful for the continuous casting operation in addition to the cooling spray or the foot roll described above. For example, thermo-couple that forecast brake-out may be attached to the shorter side frame. In this case, wirings may be disconnected or connected at the same timing as that for the attachment and detachment of the cooling water pipings. The foot roll is not restricted only to a single stage but it may be disposed by plural stages in accordance with the casting speed or the like.

Further, the cooling water channels (pipes) in the shorter side frame are not restricted to the illustrated example but the water channels in the copper plate may be of a large width. However, so long as it has been known, the illustrated type is most efficient. Further, supply·discharge ports of mold cooling water may be attached to the lower end part of the shorter side frame (the system are often adapted so far) but it is preferred to attach them to the upper end part in view of the operability. Instead of the discharging path for cooling water, discharged water may be supplied, for example, to the spray cooling water channel.

For the longer side frame, it is general to make one of them stationary and the other of movable but it is theoretically possible to make both of them movable. However, the longer side frame is an important facility to form a path line for the cast piece and it is preferred to fix one of them in view of the quality control such as for size and shape since centering is easy upon mold exchange.

The method according to this invention is suitable to continuous casting of slabs. While it may be applicable also to cast pieces of shapes other than the slabs, for example, to bloom billets, but the roll adjustment for the exclusive portion just beneath the mold is difficult. Accordingly, application to the continuous casting of slabs is most effective.

For the size of the slab, a width from 800 to 2500 mm is a suitable range but the range is not restrictive. In addition, a wide degree of freedom exists for the thickness in view of the feature of this invention and, for measure use, it is generally from 200 to 300 mm. This invention provides a large merit, particularly, to a continuous casting facility handling many kinds of thickness.

EXAMPLE

A shorter side frame and a continuous casting mold in accordance with the first embodiment (FIGS. 1 to 7) according to this invention were applied to a continuous casting line of steel slabs. In this case, the cross sectional size of the slab includes 1800 to 2500 mm width, and three kinds of thickness of 215 mm, 260 mm and 310 mm. The continuous casting speed was set to about 1.0 m/min. Each four sets of the shorter side frames were provided on each thickness and the frequency of exchange for the shorter side frame was about 15 times/month. The gap between the top end pin 21 and the concave forming portion 15 was 0.2 mm and bolt fixing/releasing operation was conducted by manual operation. Further, a portion of the upper top end pin 21 in engagement with the concave forming portion 15 was formed as a square cylindrical shape with about 50 mm for one side (chamfered) and other portion and the lower top end pin 24 are formed each into a circular cylindrical shape of about 60 mm diameter.

Change of the set thickness in the conventional mold was conducted by removing the mold main body by hoisting using a crane and setting a substitute mold again which was previously set with a shorter side frame of another thickness. Therefore, it took for about 90 min for exchange including setting of crane, entire removal of covers, the stand-by time for steam countermeasure upon lifting and the like.

However, in this embodiment, since, the setting for the thickness can be change only by the exchange of the shorter side frame, the required time is about 30 min or slightly less (about 15 min per one side) which greatly shortens the time. Further, since steams and the like are not released because the cover or the like is not detached, an evaluation that the working circumstance was improved has been obtained from operators.

INDUSTRIAL APPLICABILITY

According to this invention, since the connection mechanism between the shorter side frame and the moving device is formed into a concave shape structure to adopt a fixing system capable of easy attaching and detaching, the shorter side frame can be exchanged on-line easily and in a short period of time, which also make the change of the mold thickness in a short time.

Further, since the shorter side frame has a integral structure, there is no worry at all for the sealing failure for cooling water between the surface and the rear face of the shorter side frame, compared with existent divisional exchange type.

Further, since the thickness of the shorter side frame can be reduced, this invention can be applied even to a case of modifying the existent continuous casting mold without narrowing the castable slab width.

What is claimed is:

1. A shorter side frame for constituting a mold for use in continuous casting, comprising
   one or more of attaching/detaching mechanisms to engage a moving device for moving the shorter side frame in a forward-to-backward direction at the back of the shorter side frame, in which
   each of the at least one of the attaching/detaching mechanisms has a concave forming portion having a concave portion in engagement with a portion of the moving device and
   at least one of the attaching/detaching mechanisms has a fixing jig for fixing a portion of the moving device to the concave forming portion,
   wherein the concave forming portion has a downward opening portion, and the fixing jig is a bolt screw passing from above through the back of the concave forming portion and at least a portion of the moving device.

2. A shorter side frame for constituting a mold for use in continuous casting, comprising
   one or more of attaching/detaching mechanisms to engage a moving device for moving the shorter side frame in a forward-to-backward direction at the back of the shorter side frame, in which
   each of the at least one of the attaching/detaching mechanisms has a concave forming portion having a concave portion in engagement with a portion of the moving device and
   at least one of the attaching/detaching mechanisms has a fixing jig for fixing a portion of the moving device to the concave forming portion,
   wherein the opening of the concave forming portion is directed to the back of the shorter side frame, a portion of the lower wall of the concave forming portion is opened and, further, the fixing jig is a cotter, wherein the cotter is inserted from above between the portion of the moving device and the shorter side frame.

3. A continuous casting mold comprising:

a pair of longer side frames in which at least one of the longer side frames is movable in a forward-to-backward direction, a pair of shorter side frames put between the pair of longer side frames and movable in the forward-to-backward direction and, a pair of moving devices for moving each of the shorter side frames in the forward-to-backward direction respectively in which the shorter side frames and the moving devices for moving the shorter side frames are engaged respectively by way of one or more attaching/detaching mechanisms disposed at the back of the shorter side frames, each of the at least one of the attaching/detaching mechanisms has a concave forming portion having a concave portion engaging a portion of the moving device, and at least one of the attaching/detaching mechanisms has a fixing jig for fixing the portion of the moving device to the concave forming portion on every shorter side frame, wherein the concave forming portion has a downward opening portion, and the fixing jig is a bolt screw passing from above through the back of the concave forming portion and at least a portion of the moving device.

4. A continuous casting mold as defined in claim 3, wherein the gap of the walls of the concave forming portion sandwiching the portion of the moving device is made larger by 0.1 to 0.4 mm than the size for the portion of the moving device.

5. A continuous casting mold as defined in claim 3, wherein the portion of the moving device fixed to the concave portion of an attaching/detaching mechanism having the fixing jig has a substantially square cylindrical shape.

6. A continuous casting mold as defined in claim 3, wherein the shorter side frame has cooling water channels at the inside thereof.

7. A continuous casting mold as defined in claim 3, wherein a supply port and/or discharge port of the cooling water channel is disposed to the upper end part of the shorter side frame.

8. A continuous casting mold comprising:

a pair of longer side frames in which at least one of the longer side frames is movable in a forward-to-backward direction, a pair of shorter side frames put between the pair of longer side frames and movable in the forward-to-backward direction and, a pair of moving devices for moving each of the shorter side frames in the forward-to-backward direction respectively in which the shorter side frames and the moving devices for moving the shorter side frames are engaged respectively by way of one or more attaching/detaching mechanisms disposed at the back of the shorter side frames, each of the at least one of the attaching/detaching mechanisms has a concave forming portion having a concave portion engaging a portion of the moving device, and at least one of the attaching/detaching mechanisms has a fixing jig for fixing the portion of the moving device to the concave forming portion on every shorter side frame, wherein the opening of the concave forming portion is directed to the back of the shorter side frame, a portion of the lower wall of the concave forming portion is opened and, further, the fixing jig is a cotter, wherein the cotter is inserted from above between the portion of the moving device and the shorter side frame.

9. A continuous casting mold as defined in claim 8, wherein the shorter side frame has cooling water channels at the inside thereof.

10. A continuous casting mold as defined in claim 8, wherein a supply port and/or discharge port of the cooling water channel is disposed to the upper end part of the shorter side frame.

11. A method of exchanging, in-situ, a pair of engaged shorter side frames (referred to as A) with another pair of shorter side frames (referred to as B) in a continuous casting mold having:

a pair of longer side frames in which at least one of the longer side frames is movable in a forward-to-backward direction, a pair of shorter side frames put between the pair of the longer side frames and movable in the forward-to-backward direction and moving devices engaged by way of one or more of attachment/detachment mechanisms disposed to the shorter side frames respectively for moving the shorter side frames in the forward-to-backward direction wherein the method comprises;

a step of once stopping casting, a step of moving the shorter side frames A by the moving devices in the forward-to-backward direction and stopping the shorter side frames A at predetermined exchange positions, respectively, a step of moving at least one of the longer side frames to an aimed position in a forward-to-backward direction thereby setting an aimed slab thickness, a step of releasing the attaching/detaching mechanisms respectively for the shorter side frame A to detach the entire shorter side frames A from the moving devices respectively, a step of engaging the entire shorter side frames B having a width corresponding to the aimed slab thickness to the moving devices by way of the attaching/detaching mechanisms for the shorter side frames B respectively, a step of moving the shorter side frames B by the moving devices respectively in the forward-to-backward direction thereby setting a predetermined slab width and a step of starting casting again, wherein each of the at least one of the attaching/detaching mechanisms has a concave forming portion having a concave portion engaging a portion of the moving device, and at least one of the attaching/detaching mechanisms has a fixing jig for fixing the portion of the moving device to the concave forming portion on every shorter side frame, and wherein the concave forming portion has a downward opening portion, and the fixing jig is a bolt screw passing from above through the back of the concave forming portion and at least a portion of the moving device.

12. A method of exchanging the shorter side frames in-situ in a continuous casting mold defined in claim 11, wherein the method includes a step of stopping the supply of cooling water to the shorter side frames A before detaching the shorter side frames A from the moving devices, respectively, and detaching the supply pipes for cooling water to the shorter side frames A from the shorter side frames A respectively and further includes:
- a step of connecting the cooling water supply pipes to the shorter side frames B respectively after engagement of the shorter side frames B to the moving devices, and starting supply of cooling water to the shorter side frames B respectively.

13. A method of changing the thickness of a continuously casting slab comprising a step of exchanging the shorter side frames by the method defined in claim 11.

14. A method of exchanging, in-situ, a pair of engaged shorter side frames (referred to as A) with another pair of shorter side frames (referred to as B) in a continuous casting mold having:
- a pair of longer side frames in which at least one of the longer side frames is movable in a forward-to-backward direction,
- a pair of shorter side frames put between the pair of the longer side frames and movable in the forward-to-backward direction and
- moving devices engaged by way of one or more of attachment/detachment mechanisms disposed to the shorter side frames respectively for moving the shorter side frames in the forward-to-backward direction wherein the method comprises;
- a step of once stopping casting,
- a step of moving the shorter side frames A by the moving devices in the forward-to-backward direction and stopping the shorter side frames A at predetermined exchange positions, respectively,
- a step of moving at least one of the longer side frames to an aimed position in a forward-to-backward direction thereby setting an aimed slab thickness,
- a step of releasing the attaching/detaching mechanisms respectively for the shorter side frame A to detach the entire shorter side frames A from the moving devices respectively,
- a step of engaging the entire shorter side frames B having a width corresponding to the aimed slab thickness to the moving devices by way of the attaching/detaching mechanisms for the shorter side frames B respectively,
- a step of moving the shorter side frames B by the moving devices respectively in the forward-to-backward direction thereby setting a predetermined slab width and
- a step of starting casting again,
- wherein each of the at least one of the attaching/detaching mechanisms has a concave forming portion having a concave portion engaging a portion of the moving device, and at least one of the attaching/detaching mechanisms has a fixing jig for fixing the portion of the moving device to the concave forming portion on every shorter side frame,
- and wherein the opening of the concave forming portion is directed to the back of the shorter side frame, a portion of the lower wall of the concave forming portion is opened and, further, the fixing jig is a cotter, wherein the cotter is inserted from above between the portion of the moving device and the shorter side frame.

15. A method of exchanging the shorter side frames in-situ in a continuous casting mold as defined in claim 14, wherein the method includes a step of stopping the supply of cooling water to the shorter side frames A before detaching the shorter side frames A from the moving devices, respectively, and detaching the supply pipes for cooling water to the shorter side frames A from the shorter side frames A respectively and further includes:
- a step of connecting the cooling water supply pipes to the shorter side frames B respectively after engagement of the shorter side frames B to the moving devices, and starting supply of cooling water to the shorter side frames B respectively.

16. A method of changing the thickness of a continuously casting slab comprising a step of exchanging the shorter side frames by the method defined in claim 14.

* * * * *